United States Patent [19]
Bishop

[11] 3,979,745
[45] Sept. 7, 1976

[54] SYSTEM AND METHOD FOR LINEARIZING ANALOG MEASUREMENTS DURING ANALOG-TO-DIGITAL CONVERSION

[75] Inventor: Allen J. Bishop, Fort Worth, Tex.
[73] Assignee: Westronics, Inc., Fort Worth, Tex.
[22] Filed: Feb. 22, 1974
[21] Appl. No.: 444,953

[52] U.S. Cl. ............................ 340/347 NT; 73/1 F
[51] Int. Cl.² ....................................... H03K 13/02
[58] Field of Search ............... 340/347 NT, 347 AD; 179/15 AV; 235/197, 194; 73/341, 1 F

[56] References Cited
UNITED STATES PATENTS

| | | | |
|---|---|---|---|
| 3,092,998 | 6/1963 | Barton | 73/341 X |
| 3,349,390 | 10/1967 | Glassman | 340/347 AD |
| 3,354,452 | 11/1967 | Bard et al. | 340/347 AD |
| 3,568,181 | 3/1971 | Weaver | 340/347 AD |
| 3,662,163 | 5/1972 | Miller et al. | 340/347 AD |
| 3,685,048 | 8/1972 | Pincus | 340/347 AD |
| 3,686,665 | 8/1972 | Elias et al. | 340/347 AD |
| 3,701,145 | 10/1972 | Bergin | 340/347 NT |

*Primary Examiner*—Thomas J. Sloyan
*Attorney, Agent, or Firm*—Wofford, Felsman, Fails & Zobal

[57] ABSTRACT

An instrument for linearizing a non-linear analog output produced from a sensor such as a thermocouple to obtain a true measurement of the parameter or engineering units of interests. The full range of the non-linear analog output is divided into segments and within each segment the second slope or the rate of change of the first slope of the analog output is predetermined and stored. In carrying out measurements, the magnitude of the analog output sensed is converted to constant frequency pulses. When measurements are carried out, within a given segment the corresponding second slope data is employed to modify the frequency of the constant frequency pulses to obtain output pulses for accumulation. These output pulses have a frequency which at any given moment is representative of the first slope of the analog output and which changes at a rate representative of the rate of change of the first slope of the analog output. The resulting output pulses thus are accumulated at a non-linear rate to obtain an output that will accurately follow the non-linear curve of the sensor and which will result in a true measurement of the engineering units of interest.

8 Claims, 22 Drawing Figures

SYSTEM AND METHOD FOR LINEARIZING ANALOG MEASUREMENTS DURING ANALOG-TO-DIGITAL CONVERSION

BACKGROUND OF THE INVENTION

This invention relates to a system for linearizing a non-linear output produced as a function of a parameter of interest and which employs second slope data for carrying out the linearization.

Analog voltage to digital count conversion techniques are frequently used to obtain digital data representing non-linear curves or functions obtained in certain meeasurements. For example, these techniques may be employed to measure the voltage, in digital form, of a thermocouple, which has a non-linear temperature-voltage function. In order to obtain a true measure of temperature, however, the digital data must be "linearized", i.e., it must be made proportional to the temperature rather than to the voltage.

A popular method of linearization involves establishing a gating signal that is proportional in time duration to the voltage measured. This gating signal is used to pass pulses from a clock generator to a pulse counter. To achieve linearization, the frequency of these pulses is modified and made proportional to the average voltage slope over each of a plurality of segments into which the temperature-voltage curve is divided. Thus within each segment, the output frequency of the pulses will be constant and proportional to the average slope of the corresponding segment. The resulting pulses are accumulated for each measurement for display purposes. The resultant measurement, when obtained over the full range of the thermocouple, results in a broken approximation of the temperature-voltage curve made up of straight lines, one straight line for each segment.

This linearization technique has disadvantages in that it inherently produces significant errors at the ends and/or midpoints of each segment if the temperature-voltage function is not a straight line.

SUMMARY OF THE PRESENT INVENTION

It is an object of the present invention to accurately linearize a non-linear output to obtain an accurate representation or measure of the parameter or engineering units of interest.

It is a further object of the present invention to employ the second derivative or the second slope of the non-linear output to carry out linearization for the production of counts at a frequency which changes as a function of the rate of change of the slope of the non-linear output.

It is another object of the present invention to provide a method and apparatus for linearizing a non-linear analog output produced as a function of a variable of interest.

The method and apparatus includes the steps of and means for producing a quantity of constant frequency pulses representative of the magnitude of the analog output. These constant frequency pulses are converted to counts or pulses whose frequency changes as a function of the rate of change of the slope of the analog output.

In a further aspect, the technique and apparatus are employed for linearizing a non-linear analog output produced by a sensing means as a function of a variable parameter sensed. The magnitude of the analog output is converted to a time period representative of the magnitude and a quantity of first pulses at a constant frequency pulses are produced during said time period and representative of the magnitude of said analog output. In response to the first pulses, second pulses are produced at a frequency representative of the rate of change of the slope of the analog output within a given segment of a given range of the analog output capable of being produced by the sensing means. In response to the first pulses and to the second pulses, output pulses are produced at a frequency which changes as a function of the rate of change of the slope of the analog output within said given segment. These output pulses are accumulated during the time period of the measurement for producing an output representative of the magnitude of a parameter sensed and corresponding to the magnitude of the analog output produced.

In a further aspect, the apparatus comprises means for storing a plurality of functions, each of which represent the rate of change of the slope of the analog output within a different segment of a given range of the analog output capable of being produced by the sensing means. First conversion means is employed responsive to the first pulses and sequentially responsive to selective ones of said functions for producing second pulses at a frequency representative of the rate of change of the slope of said analog output within said segments corresponding with said selective functions. Counter means is provided responsive to said second pulses for producing a binary output representative of the slope of said analog output within said segments and which changes at a rate representative of the rate of change of said slope within said segments. Second conversion means is provided responsive to said first pulses and to said changing binary output for producing output pulses at a frequency which changes as a function of the rate of change of the slope of said analog output within said segments. In addition, means is provided for accumulating the output pulses during said time period for producing an output representative of the magnitude of said parameter sensed and corresponding to the magnitude of said analog output produced.

DESCRIPTION OF THE PRIOR ART

Figure 1:
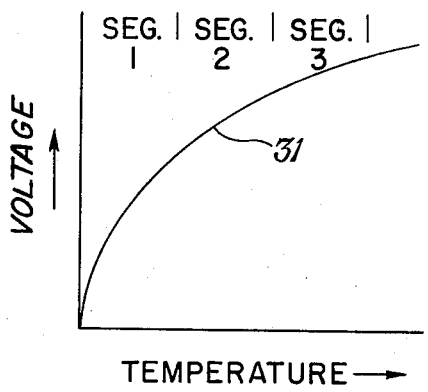
FIG. 1 illustrates a non-linear curve produced by a sensor or transducer such as a thermocouple.
Figure 2:
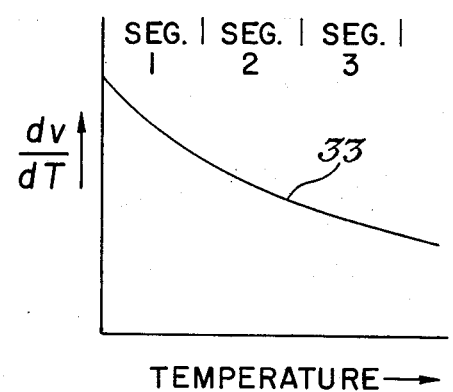
FIGS. 2–4 are curves useful in understanding one prior art technique of linearization.
Figure 3:
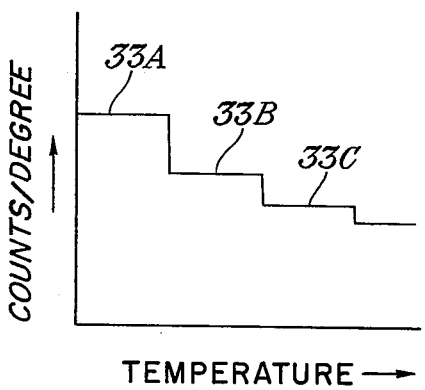
Figure 4:
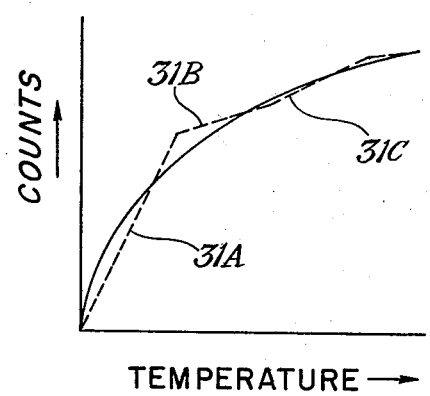

Referring now to FIGS. 1–4, there will be briefly described one prior digital technique for linearizing the non-linear analog output of a sensor employed to measure a parameter of interest. Assume that the sensor is a thermocouple which produces a voltage in response to the temperature being measured. The voltage may be either positive or negative with respect to a given reference. Its output may be as illustrated by curve 31 in FIG. 1. Note that the voltage produced is a non-linear function of temperature over the effective range of the thermocouple. For a given thermocouple, the curve 31 is predetermined and from this curve, the slope of the temperature-voltage curve is determined as illustrated at 33 in FIG. 2. The temperature-voltage curve and its slope are divided into segments, three of which are illustrated in FIGS. 1 and 2. Within each segment, the average slope is found and assumed constant over the segment. This is depicted by FIG. 3 wherein straight line portions 33a, 33b, 33c represent the average value of the slope 33 for segments 1–3. Note that the average slope is high in the first segment and decreases stepwise in the other segments. In the prior technique, the step-like constant slope lines 33a, 33b, 33c, etc. are employed for linearization purposes.

In carrying out linearization, there is employed an analog to digital converter such as a dual slope integrator or an up-down integrator A/D converter which periodically establishes a gating signal that is proportional in time to the voltage measured by the sensor. This gating signal is used to pass to a modification circuit, constant frequency pulses from a clock generator. Within each segment in which measurements are being made, the modification circuit modifies the frequency of the pulses from the A/D converter to be proportional to the average temperature-voltage slope within that segment. The pulses from the modification circuit are accumulated, during each time period of measurement, by a register for display purposes, and taken as representative of the temperature corresponding with the voltage being measured. Since the value of the average slope is assumed constant within a given segment, the frequency of the modified pulses is constant and the pulses are accumulated by the register at a constant rate. This occurs in each segment in which measurements are being made. Thus, since the pulses are accumulated at a constant rate within each segment, the resultant measurement when obtained over the full range of the thermoucouple, results in a broken approximation of the temperature-voltage curve made up of straight lines, one straight line for each segment, as illustrated by dotted line segments 31a, 31b, and 31c in FIG. 4. As indicated above, the disadvantage of this technique of linearization is that it inherently produces significant errors at the ends and/or midpoints of each segment if the temperature-voltage function is not a straight line. In order to obtain good conformity to the non-linear curve, the full range must be divided into a large number of segments, however, this complicates the circuitry.

DETAILED DESCRIPTION OF THE INVENTION

Figure 5:
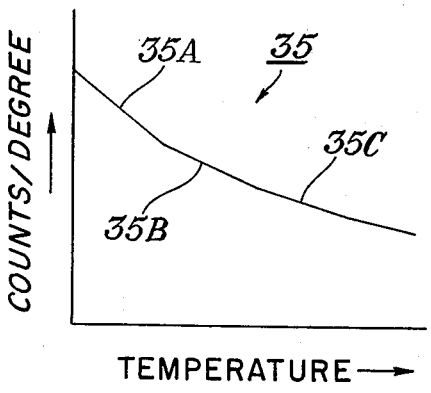
FIGS. 5 and 6 are curves useful in understanding linearization by the present invention.
Figure 6:
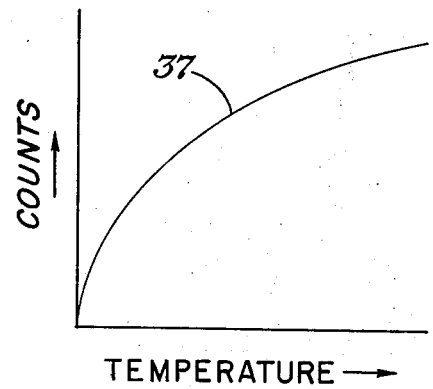

In accordance with the present invention, the second derivative of the slope of the non-linear analog output is predetermined and employed for linearization. As is well known, the second derivative, or the second slope, represents the rate at which the first slope changes. The non-linear analog output and the second slope are divided into segments and within each segment, the average value of the second slope is determined as depicted by lines 35a, 35b, 35c, in FIG. 5. Although these lines represent a constant rate of change of the slope within the segments, together they closely approximate the first slope over the full range of measurement. When measurements are carried out within a given segment, the corresponding second slope data is employed to modify the frequency of the constant frequency pulses to obtain output pulses for accumulation. These output pulses have a frequency which at any given moment is representative of the first slope of the analog output and which changes at a rate representative of the rate of change of the first slope of the analog output. The resulting output pulses thus are accumulated at a non-linear rate proportional to the rate of change of the slope and hence are accumulated at a rate that will follow the non-linear curve produced by the sensor and which will result in a true measurement of temperature, if the sensor being employed is a thermocouple. The output of the register in this instance, over the full range of the thermocouple will be illustrated by curve 37 in FIG. 6. Note that this curve is a smooth curve corresponding to curve 31 of FIG. 1 and hence results in a true measurement of the engineering units of interest, temperature in this case, without the disadvantages of the measurements obtained by the prior technique, as mentioned above.

Figure 7:
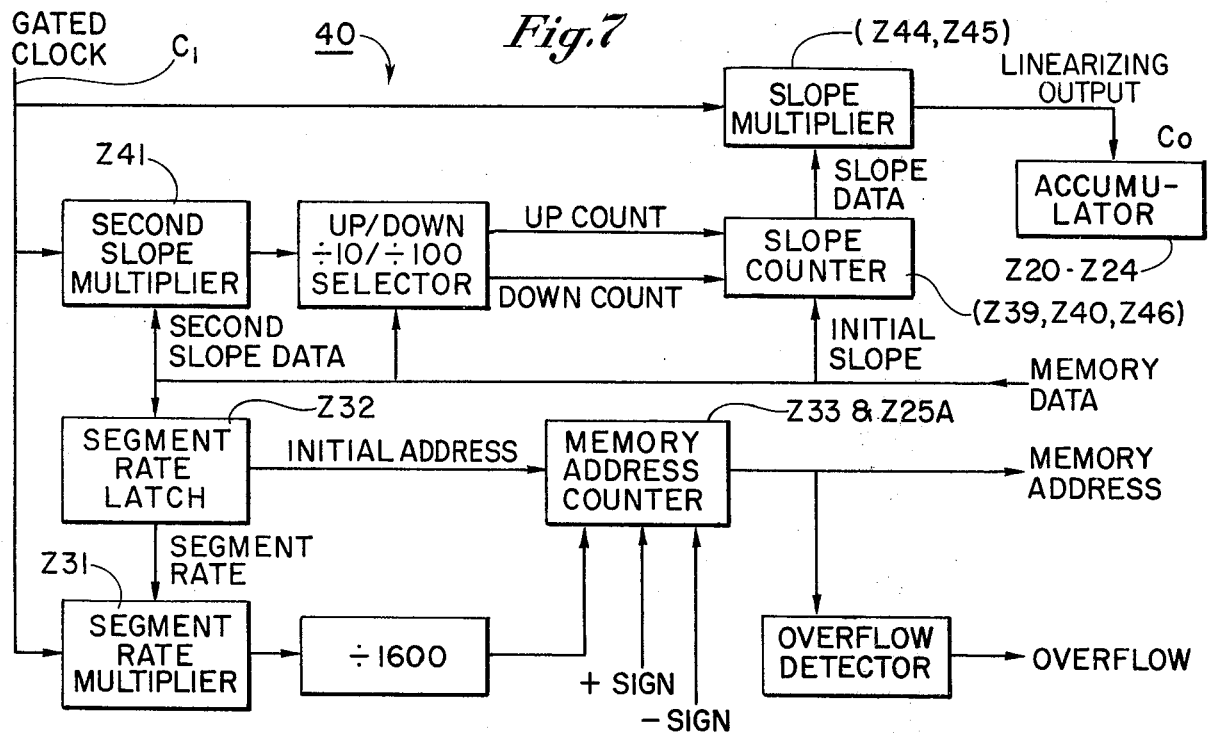
FIG. 7 is a block diagram of the linearizer of the present invention.

Referring now to FIG. 7, there will be briefly described the linearizing system of the present invention and its manner of operation. FIG. 7 is a block diagram of the linearizer which is identified by reference numeral 40. Initially, only the basic blocks will be described. In FIG. 7, the basic blocks, as well as other blocks are identified by reference numerals having Z prefixes which correspond with the components illustrated in FIG. 13c. Assume that the linearizing system of the present invention is employed with a thermocouple for measuring temperature although it could be employed with other devices such as devices for measuring resistance as a function of temperature. Although not shown in FIG. 7, it is to be understood that an A/D converter is employed periodically to convert the magnitude of the voltage measured to a time proportional to the voltage and which is employed as a gating signal to pass constant frequency pulses during each time period from a clock generator. The pulse train of these constant frequency pulses is defined by $C_i$, and is applied to a second slope multiplier Z41 and also to a slope multiplier Z44, Z45. The output of the second slope multiplier is applied by way of an up-down, divide by 10 or divide by 100 circuitry to a slope counter Z39, Z40, Z46, whose output in turn is applied to the slope multiplier Z44, Z45. The output of the slope multiplier are pulses which are accumulated by a register or accumulator Z20–Z24 during the measurement period and which produces a digital output of the engineering units being measured, in this case, temperature. $C_0$ represents the accumulated counts in the accumulator Z20–Z24.

The second slope multiplier Z41 and the slope multiplier Z44, Z45 are commercially available units known as binary rate multipliers and produce an output frequency defined by the following relationship:

$$f_{out} = \frac{M \cdot f_{in}}{K} \qquad (1)$$

Where:
$f_{in}$ = frequency of input pulses;
M is a rate input which is a binary number;
K is a constant which is characteristic of the circuitry; and
$f_{out}$ is an output pulse frequency which is proportional to the value of the rate input M, assuming that $f_{in}$ is constant.

The slope counter counts frequency pulses applied to its input and produces a binary output representative of the counts accumulated and which changes at a rate proportional to the frequency of its input.

In operation, an initial slope of the curve 31 is programmed into the slope counter Z39, Z40, Z46, whereby its binary output represents that initial slope. In addition, assuming that measurements are being made in the first segment, the rate input M applied to the second slope multiplier Z41 is proportional to the second slope or to the rate of change of the first slope over the first segment assuming, measurements are being made in the first segment. The binary output of the counter Z39, Z40, Z46 thus changes at a constant rate proportional to the rate of change of the first slope within that segment. At any given moment, the count in the counter Z39, Z40, Z46 represents the slope of the curve 31 but which is constantly changing at a fixed rate proportional to the rate of change of the slope of the curve 31 within a given segment. Since this changing binary number is applied as the rate input M to the slope multiplier Z44, Z45, its output frequency, $f_{out}$, is constantly changing at a rate specified by the rate of change of the slope over the segment during which measurements are being made. Thus at any given moment, the output frequency of the slope multiplier is proportional to the slope and the rate of the change of the output frequency is proportional to the rate of change of the slope over the given segment. Hence the counts accumulated by the accumulator Z20–Z24 are accumulated at a rate that will follow the curve 31 and hence represents the true temperature during the time period of which measurements are being made.

Figure 9:
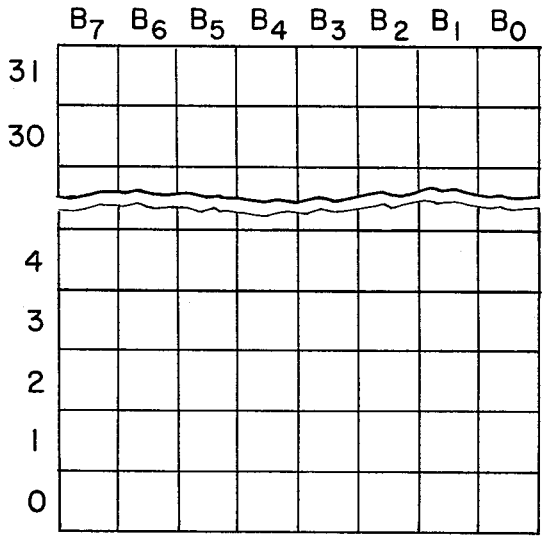
FIG. 9 depicts a storage or memory device for storing data for use in carrying out linearization for the present invention.
Figure 10:
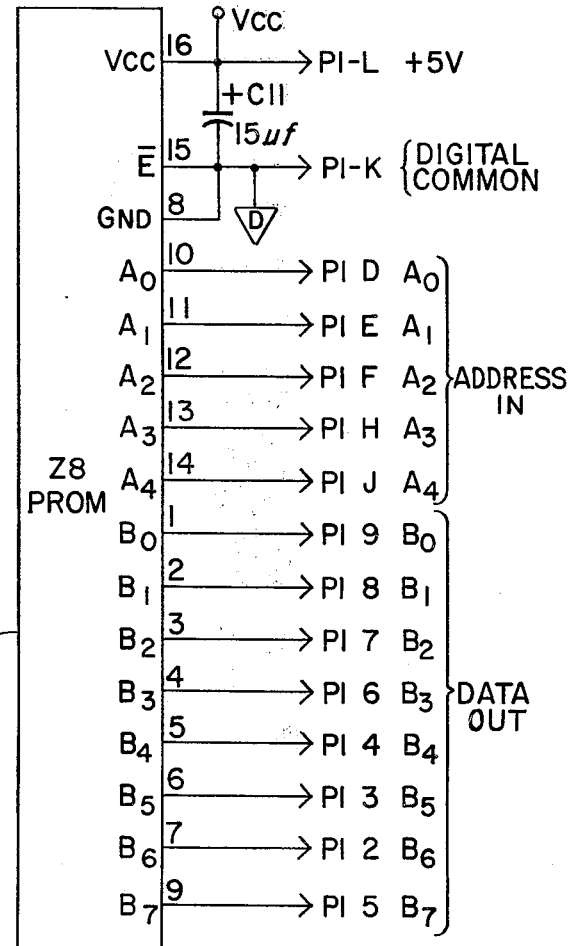
FIG. 10 is a block diagram of the memory device.
Figure 13A:
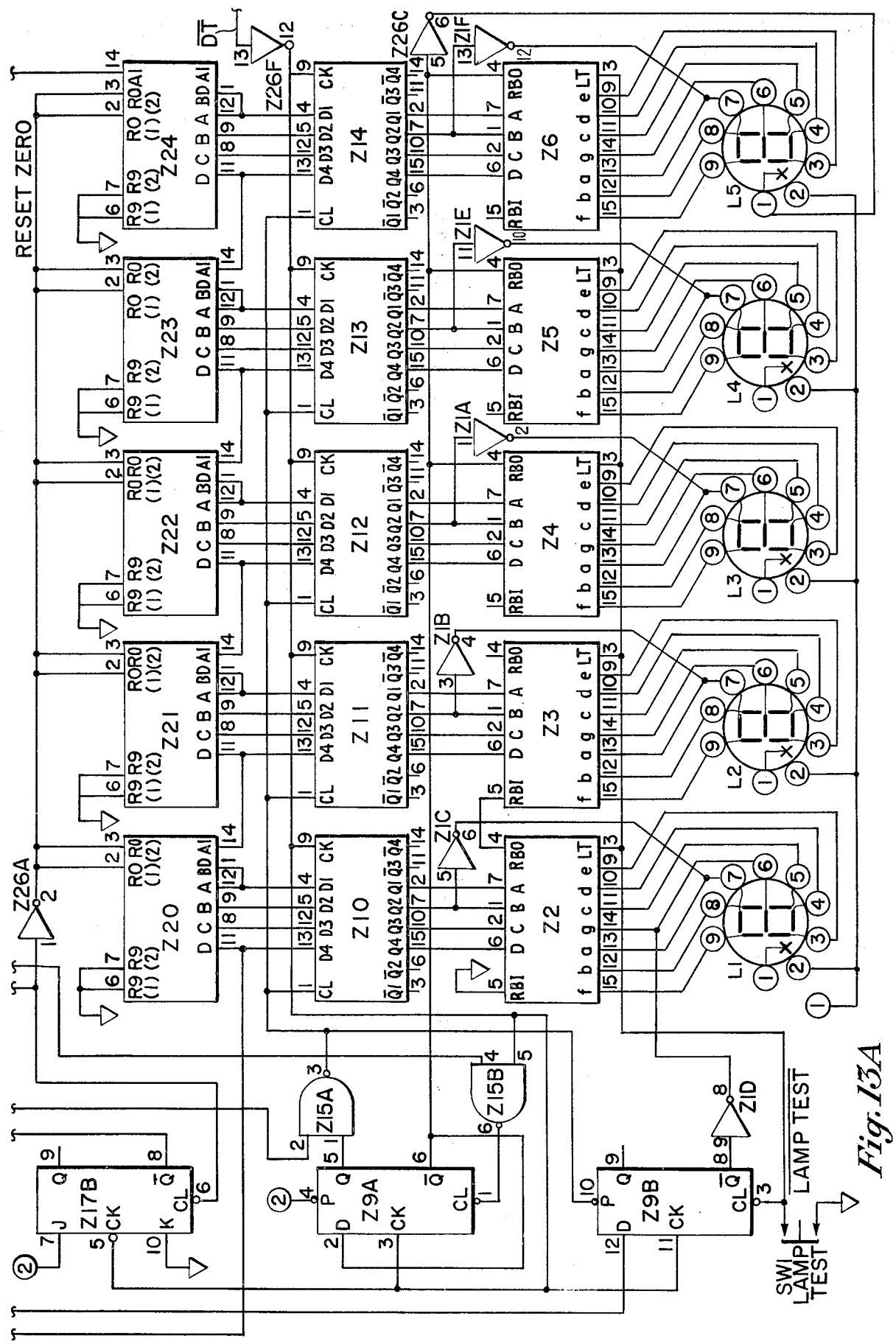
FIGS. 13a–13c are a schematic of the linearizer and control circuitry of the present invention, FIG. 13c corresponding with FIG. 7. The complete circuit of FIGS. 13a–13c may be viewed by placing FIG. 13a below FIG. 13b and by placing FIG. 13c to the right of both FIGS. 13a and 13b with thhe appropriate electrical connections correctly matched.
Figure 13B:
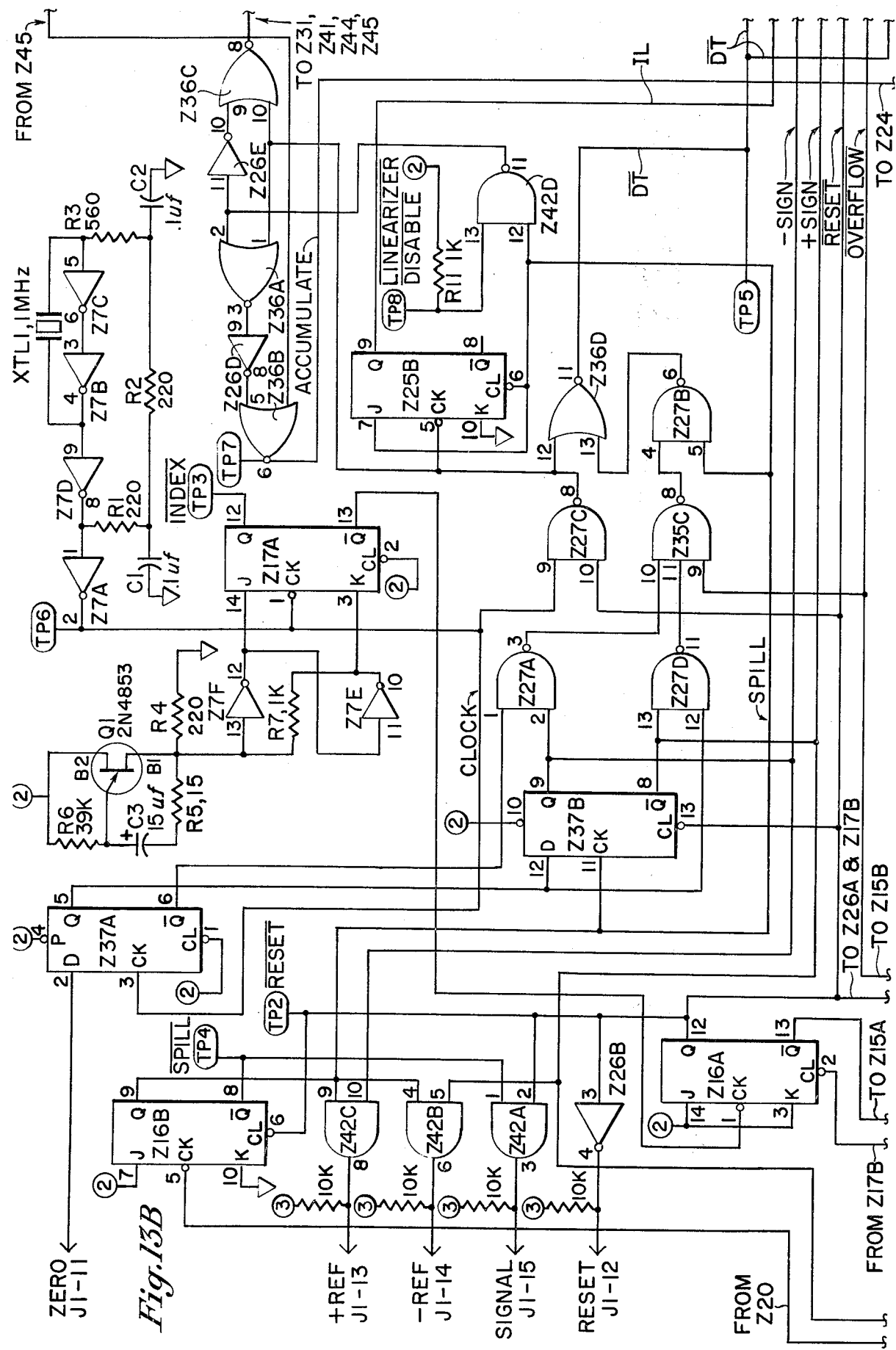
Figure 13C:
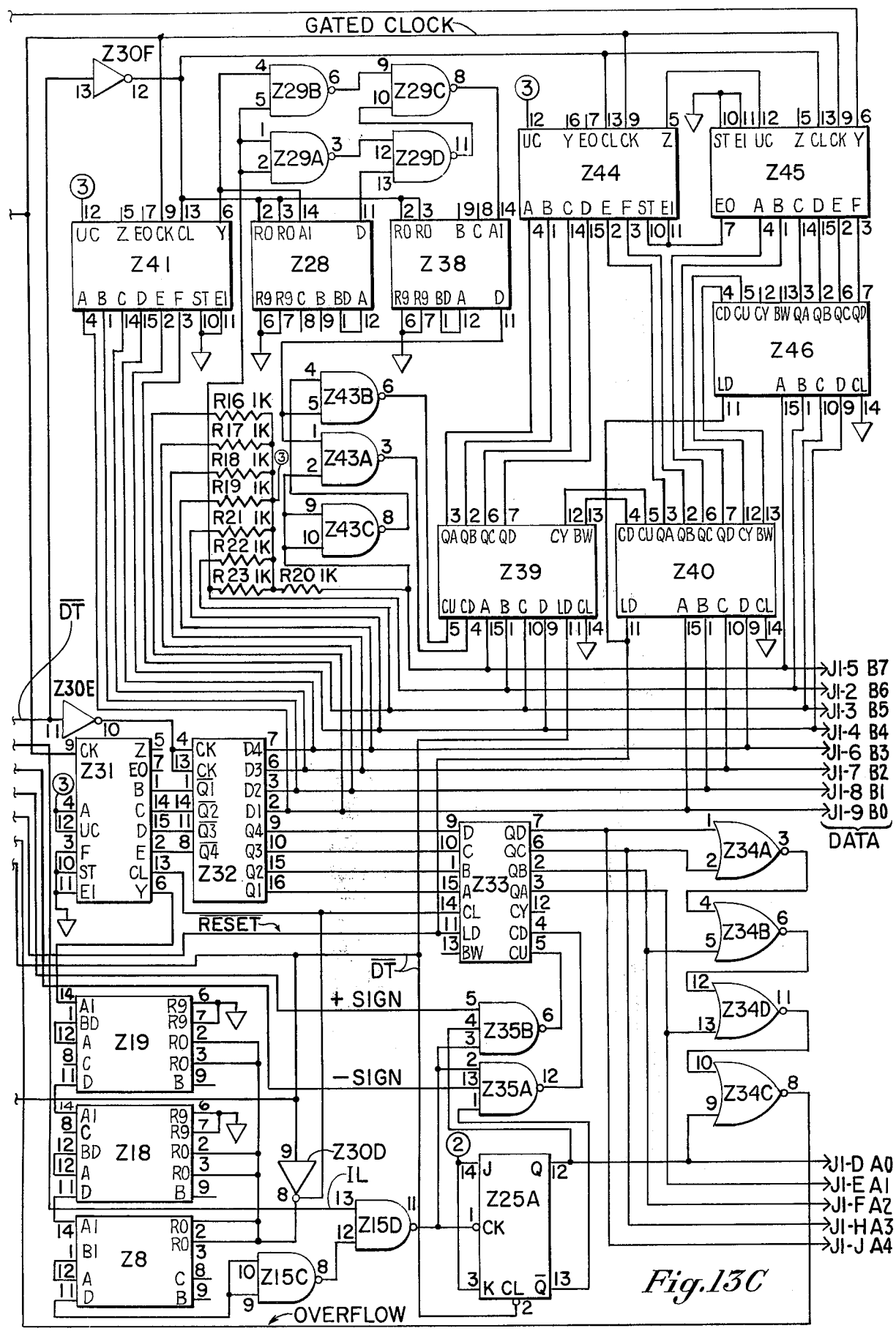

FIG. 13c is a schematic of the block diagram of FIG. 7 with the components of the blocks illustrated in more detail as well as the connecting lines. The slope counter is formed by three, four-bit binary counters Z39, Z40, and Z46 cascaded to obtain a 12-bit binary counter. The slope multiplier is formed by two 6-bit binary rate multipliers Z44 and Z45 also cascaded. The 12 outputs of Z39, Z40, and Z46 are fed into the 12 inputs of Z44 and Z45 and the output of the slope multiplier is taken from pin 6 of Z45. The second slope multiplier is a 6-bit binary rate multiplier Z41 while the segment rate multiplier is a 6-bit binary rate multiplier Z31 having two input bits held constant. The segment rate latch is formed by a storage device Z32 that will store 4-bits of binary data. The divide by 10 and divide by 100 circuitry is formed by two divide by 10 counters Z28 and Z38 appropriately gated while the divide by 1600 unit is formed by two divide by 10 counters Z19 and Z18 and one divide by 16 counter Z8 appropriately connected. The memory address counter is formed by a four-bit binary counter Z33 and a flipflop Z25A to obtain five address lines which are coupled to a programmable read only memory which is illustrated at 51 in FIGS. 8 and 10. The programmable read only memory has 32 8-bit locations into which 32 binary words of 8-bits are programmed. The memory is depicted in FIG. 9 and it is programmed in the following manner. Four bits, B4–B7 of the word in the zero address represent the four least significant bits of the initial slope 33 of a given sensor or transducer while the other four bits B0–B3 define the address of the second word which will be addressed by the system in its operation. The second word addressed will not necessarily be located in address labeled "one", but may be for example, located in the address labeled "ten". The eight bits of the second word addressed represent the eight most significant bits of the initial slope of the given sensor or transducer. The remaining thirty words located in the remaining thirty addresses of memory are second slope data of thirty segments into which a given sensor curve may be divided. Although the following discussion will refer to the curve as being divided into thirty segments, it is to be understood that the curves may be divided into a lesser number of segments. The data in bit B7 of the thirty other addresses represent the signs of the second slopes for the corresponding segments while the data in bit B6 determine whether the output from the second slope multiplier for each segment shall be divided by 10 or by 100. The remaining 6 bits, B0–B5, in the remaining thirty addresses are data representative of the second slope for each of the thirty segments of a given sensor curve. The programmable read only memory has five address lines and eight output lines. Since the memory address counter has five address lines, a total of 32 combinations can be obtained whereby any word of the 32 words may be addressed in memory.

The data programmed into the memory depends upon the characteristics of a given type of sensor or transducer and which characteristics are available from the technical data and specifications of the sensors commercially available. Thus, a given memory is programmed for a given range of a given type of sensor such as a thermocouple and is to be used only with that type of sensor.

Figure 8:
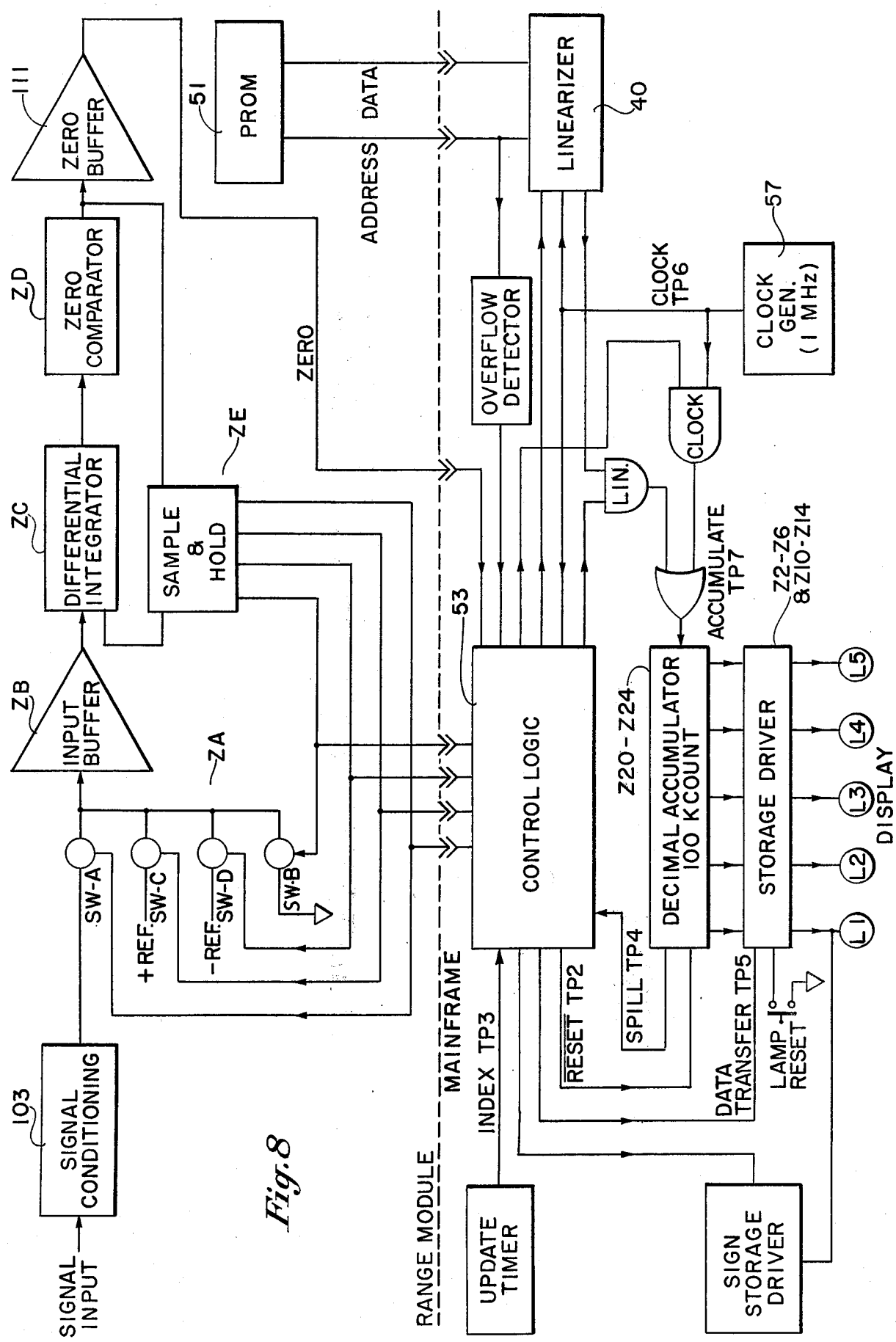
FIG. 8 is a block diagram of the complete system of the present invention including the linearizer and other components.

Referring to FIG. 8, the programmable read only memory 51 forms part of a range module which also includes an analog to digital converter, in this case, a dual slope integrator which is also known as an up-down integrator, analog to digital converter and which comprises a differential integrator ZC and a zero comparator ZD. For a detailed description of an up-down integrator, analog to digital converter, reference is made to *Analog-to-Digital/Digital-to-Analog Conversion Techniques*, by David F. Hoeschele, Jr., pp. 381–384. In use, the range module will be plugged into a main frame which includes the linearizer 40, control logic 53, the accumulator or register Z20-Z24, a storage driver Z2-Z6 and Z10-Z14, display units L1-L5, and other circuitry.

A brief description of the operation of the entire system including the main frame and range module now will be given. Reference will be made to FIGS. 8, 11a–11c, and 13c. After a given measurement is made and before the next measurement, data is transferred out of the first two words of memory and loaded into the linearizer. The first word in memory is defined as word zero and is located in the zero address. It is always addressed first for each measurement. Four bits of the first word represent the four least significant bits of the initial slope, while the other four bits specify the address of the second word. These other four bits also define the length or duration of each segment. The eight bits of the second word represent the eight most significant bits of the initial slope. The remaining thirty words in memory are second slope data for the thirty segments as mentioned above.

After a given measurement, a data transfer pulse is produced and then a reset pulse which follows the data transfer pulse. The data transfer pulse sets all of the five outputs of the memory address counter Z33 and Z25A to zero thus causing word zero in memory to be addressed. Therefore, word zero is transferred through eight data lines B0–B7 to the linearizer. The bits on B4–B7 are fed into Z39 and loaded. Again, these four bits represent the least significant bits of the initial slope. As indicated above, the other four bits of word zero specify the address of the next word in memory. These four bits are routed on lines B0–B3 to the segment rate latch Z32 and loaded. They are stored in the segment rate latch for the duration of a measurement. They are also routed to Z33 of the memory address counter and their inverse are fed to the segment rate multiplier Z31 as will be described subsequently. Thus, the first word is transferred out of memory into Z39 of the slope counter and into the segment rate latch Z32. The remaining eight bits of the initial slope are loaded next. They are located in memory at a position dependent upon the relative magnitudes of positive and negative full scale readings. The address in memory of these eight bits is available from the four bits stored in the segment rate latch. The reset pulse is employed to load into Z33 of the memory address counter, the four bits previously loaded into and now stored in the segment rate latch. When Z33 is loaded with this data, the memory address counter is preset to the number specified by the four bits of the first word on B0–B3. Thus, the second word is addressed and data is transferred from the second word of memory to the linearizer by lines B0–B7. This data is the eight most significant bits of the initial slope, and is loaded into counters Z40 and Z46. Thus, all 12 bits of the initial slope are loaded into the slope counter.

Figure 11A:
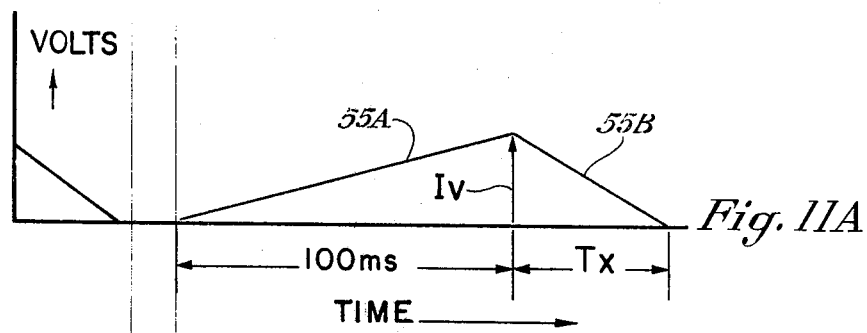
FIGS. 11a–11c are timing diagrams useful in understanding the present invention.

To begin a measurement, the unknown voltage from the sensor (labeled "signal input" in FIG. 8) is fed into the integrator ZC, which is an inverting integrator, for a known period of time (100 milliseconds). This is accomplished with an indexing pulse that occurs once every second whereby a new measurement is begun each second. In response to the indexing pulse, a control signal is produced which is applied to gate SW-A of switching system ZA to allow passage of the signal input from the sensor to the integrating circuitry. The integrator is allowed to charge for a fixed period of time (100 milliseconds) to generate a ramp voltage, as illustrated at 55a in FIG. 11a. At the end of the 100 milliseconds, the voltage to which the integrator has charged is proportional to the input voltage. The time of charging of the integrator is controlled by the 100,000 count accumulator Z20-Z24 which now acts as a timer. When charging begins, pulses at one megahertz from a clock generator 57 are fed into the accumulator Z20-Z24. Thus, 100 milliseconds are required for the accumulator to accumulate 100,000 counts. At the end of 100,000 counts (100 milliseconds), the accumulator produces a signal which causes the control logic 53 to close gate SW-A and to open either of gates SW-D or SW-C to apply a reference voltage across the integrator. The reference voltage has a polarity opposite that of the signal input voltage and causes the integrator to discharge toward zero. In FIG. 11a, the integrator output during discharge is illustrated at 55B. For example, if the signal input is negative, the ramp 55A will be positive, recalling that the integrator ZC is an inverting integrator. Thus, gate SW-C will be opened to apply a positive voltage across the integrator to cause it to discharge to zero. Since the characteristics of the integrator are known and fixed and since the applied reference voltage is known, the integrator discharge rate is known and fixed. Hence, since the value to which the integrator has charged is proportional to the input voltage, the time required for the integrator to discharge down to zero also is proportional to the input voltage and hence proportional to the output voltage of the sensor. The time for discharge is depicted by $T_x$ in FIG. 11a. The integrator is adjusted such that for a full scale input, 102.4 milliseconds are required for the integrator to discharge to zero. During the time of discharge, fixed frequency counts or pulses from the clock 57 are passed or gated to the linearizer. Thus, the sensor output is converted to digital pulses proportional in number to the amplitude of the sensor output.

In the present system, the fixed frequency pulses, during linearization, are applied to the slope multiplier Z44, Z45 and to the second slope multiplier Z41, as described previously, as well as to the segment rate multiplier Z31. Linearization begins at the end of the 100th millisecond when the reference voltage is applied to the integrator to cause its capacitor to begin discharging. During linearization, the accumulator Z20-Z24 no longer acts as a timer but is used to accumulate the output pulses from the slope multiplier Z44, Z45. Before linearization can begin, however, the second slope of the next word in memory must be addressed and transferred to the linearizer in order to obtain second slope data for linearization. One half of a clock cycle after the 100,000th count in the accumulator, an initiate linearization signal is produced. This signal is applied to toggle flipflop 25ZA which is the least significant bit counter of the memory address. When it toggles, it causes the memory address to either advance or step down one word from the previous word depending upon whether the sign of the measurement is positive or negative. Thus the system has moved to the next word address and six bits of the second slope data B0–B5 of this word now are fed into the second slope rate multiplier Z41. Subsequent memory words (one word per segment) are addressed sequentially higher or lower dependent on whether the sign of the measurement is positive or negative respectively. The control logic determines whether the memory address advances or steps back.

Linearization can now begin. During linearization, clock pulses are routed to the slope multiplier Z44, Z45, to the second slope multiplier Z41 and to the segment rate multiplier Z31, as indicated above. The output frequency from the slope multiplier Z44, Z45 depends upon the binary input applied from Z39, Z40, and Z46 and is fed to the accumulator as indicated previously. The output frequency from the second slope multiplier Z41 is routed through a switch Z29A, Z29B, Z29C, Z29D, to either Z28 or Z38 which are divide by 10 or divide by 100 units. One bit of the second slope data, B6, determines whether the output of the second slope multiplier is routed to Z28 and then to Z38 or directly to Z38. Thus, the output of the second slope multiplier is divided by 10 or by 100. The purpose of the divide by 10/divide by 100 is to permit selection of either a high or low frequency into the slope counter in order to accommodate either a rapidly or a slowly changing slope. The output of Z38 is fed by way of another gating arrangement Z43A, Z43B, Z43C to either the count up or count down inputs of counter Z39 to cause the slope counter to either count up or count down. The gating arrangement Z43A, Z43B, Z43C is controlled by the data on B7 which represents the sign of the second slope and which controls whether the slope in the slope counter is increasing or decreasing. Thus, one bit of the second slope data tells the system whether the output from the second slope multiplier should be divided by 10 or by 100; one bit tells the system whether the slope counter should be counting up or down; and the remaining bits are fed into the second slope multiplier Z41 that defines at what rate counts should be fed into the slope counter. The inverse of the four bits, B0–B3, of the data from word zero that specifies the initial address of the second address word is fed from the segment rate latch Z32 into the segment rate multiplier Z31. The output frequency of Z31 is applied to Z19, Z18, and Z8 where it is divided down by 1600 to slow down the rate at which the memory address is changing. Every time the divide by 1600 is cycled through, Z8 produces an output pulse which causes the memory address to advance up or step down one word to move to the next word address and hence to transfer its second slope data into the linearizer. The data fed into the segment rate multiplier Z31 from the segment rate latch Z32 determines the frequency output of the segment rate multiplier Z31. Thus, this data (data from the first word that is loaded into the segment rate latch) determines the frequency at which the memory address counter changes and hence regulates the duration of each segment, each segment being coincident with a memory word address. Recalling also that the fixed frequency clock pulses are fed into the segment rate multiplier, the segment rate latch and the segment rate multiplier act to divide the full scale of the clock pulses and hence the full range of the thermocouple curve into equal segments. By specifying the segment rate as being the inverse of the initial address combined with the division by 1600 of the input to the memory address counter, the remaining memory after the second word is devoted to positive measurements and is always caused to be cycled through in 102,400 clock pulses, for a full scale measurement. 102,400 counts is defined as positive full scale as indicated above.

Linearization continues with data from the segment rate latch regulating the duration of each segment and the second slope memory word data regulating the rate and direction of change of slope data, which changes continuously and smoothly as required. During linearization, as the integrator discharges toward zero, the accumulator thus accumulates counts at a non-linear rate thereby following the sensor curve. For each measurement period, the linearizer will follow the curve through one or a number of segments, depending upon the magnitude of the measurement from the sensor and hence the time required for the integrator to discharge through zero. At that time, when the integrator discharges through zero, the counts accumulated in the accumulator will be proportional to the engineering units being measured. Accumulation then is terminated and the data from the accumulator is transferred to the storage drive Z10–Z14 and Z2–Z6 and then to the display L1–L5 for the completion of the one cycle of measurement. Detection of the zero crossing of the output of the integrator is carried out by a zero comparator ZD and the control logic as will be described subsequently.

Figure 12:
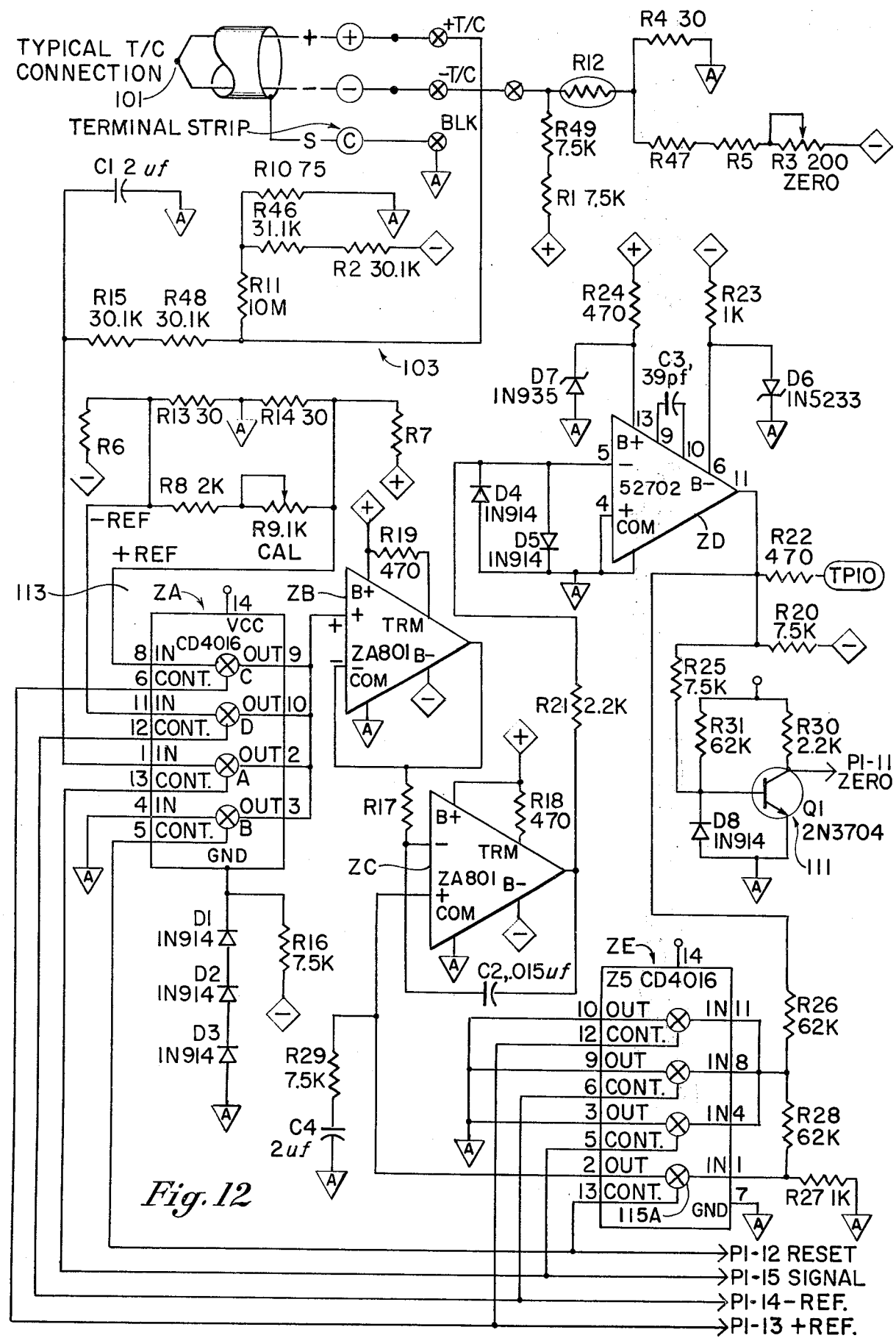
FIG. 12 is a schematic of circuitry used with a sensor or transducer to be employed with the linearization system of the present invention.

Referring now to FIGS. 8 and 12, there will be briefly described the range module for a thermocouple illustrated at 101. The output of the thermocouple is applied to a signal conditioning circuitry 103 which is coupled to an electronic switching system ZA comprising four switches SW-A, SW-B, SW-C, and SW-D which are conventional MOS field effect transistors. The signal conditioning circuitry 103 provides an offsetting voltage so that the voltage input to the instrument will be zero when the temperature being measured is zero. When the temperature is negative with respect to zero, a negative input voltage will be applied to the instrument. Conversely, when the temperature is positive with respect to zero, a positive input voltage will be applied to the instrument. The output of the thermocouple is connected to switch SW-A, which passes the thermocouple output to the integrator ZC by way of a buffer amplifier ZB. The integrator ZC produces an inverted output which is applied to a zero comparator ZD which also produces an inverted output. This output is applied to an inverting amplifier 111, its output of which is applied to the circuitry in the main frame. During the measurement period, gate SW-A is opened by a signal applied to the line labeled "signal" and integration is carried out for the predetermined time period of 100 milliseconds. At the end of that time period, the signal on the signal line is discontinued and a signal is applied to either the minus reference or plus reference line to open either of gates SW-D or SW-C to pass either a minus reference voltage or a plus reference voltage from the circuitry illustrated at 113. In the event that the signal ramp being generated by the integrator is a positive going ramp, then the voltage from the thermocouple has a negative value whereby the switch SW-C is opened to pass a positive reference voltage from circuitry 113, thereby causing the reference voltage to discharge the integrator back down to zero. At the end of the measurement, the reset signal is produced thereby opening gate SW-B of switching circuitry ZA and a gate 115A of a sample and hold circuitry ZE, the latter of which includes capacitor C4. When switch SW-B is turned on, its input is grounded whereby a ground signal is applied to the amplifier ZB to cause it to go to zero. At the same time, a negative feed-back is applied by way of the sample and hold circuitry ZE to the integrator ZC to cause the integrator ZC and the comparator ZD to go to zero. This automatically zeros the circuitry. Negative feedback is obtained from C4 which charges to the voltage across R27 when switch 115A is opened. Thus, between measurements, the circuitry is in a zero condition so that when another measurement is started, everything is at a zero state. The control signals come from the main unit which now will be described in detail, with reference to FIGS. 13a, 13b, and 13c. In these figures, there are illustrated a number of components which are commercially available and are identified with the prefix Z and a numerical designation. These components are listed and defined below in Tables I and II. Some of these components have been previously defined. In Table I, column 2 identifies the reference designation used in this application. Column 1 of Table I and column 1 of Table II identify the numerical type conventionally used by the industry and well known to those skilled in the art. Column 2 of Table II identifies the type of the component in terms of its function, also well known to those skilled in the art. Columns 3–5 of Table I define voltage levels identified in FIGS. 13a–13c. In FIGS. 13a–13c, the symbols used for the components are conventional, as well as their input and output pin designations and hence it is not thought that further description at this point is necessary.

TABLE I

| Type | Ref. Des. | Vcc 2 | Vcc 3 | COM |
|---|---|---|---|---|
| 7400 | Z15,27 | 14 | | 7 |
| 7400 | Z29,43 | | 14 | 7 |
| 7404 | Z7,26 | 14 | | 7 |
| 7404 | Z30 | | 14 | 7 |
| 7408 | Z42 | 14 | | 7 |
| 7410 | Z35 | | 14 | 7 |
| 7416 | Z1 | 14 | | 7 |
| 7432 | Z34 | | 14 | 7 |
| 7432 | Z36 | 14 | | 7 |
| 7447 | Z2,3,4,5,6 | 16 | | 8 |
| 7473 | Z16,17,25 | 4 | | 11 |
| 7474 | Z9,37 | 14 | | 7 |
| 7475 | Z32 | | 5 | 12 |
| 7490 | Z18,19,20,21, 22,23,24 | 5 | | 10 |
| 7490 | Z28,38 | | 5 | 10 |
| 7493 | Z8 | 5 | | 10 |
| 7497 | Z31,41,44,45 | | 16 | 8 |
| 74175 | Z10,11,12,13,14 | 16 | | 8 |
| 74193 | Z33,39,40,46 | | 16 | 8 |
| 7805 | Z47,48,49 | — | — | — |

TABLE II

| 7400 | Quad NAND Gate |
|---|---|
| 7404 | Hex Inverter |
| 7408 | Quad AND Gate |
| 7410 | Triple 3-Input NAND gate |
| 7416 | Hex Inverter/Buffer |
| 7432 | Quad OR Gate |
| 7447 | BCD to 7 Segment Converter |
| 7473 | Dual J-K Flipflop |
| 7474 | Dual Type D Flipflop |
| 7475 | 4-Bit Bi-Stable Latch |
| 7490 | 4-Bit BCD Counter |
| 7493 | 4-Bit Binary Counter |
| 7497 | 6-Bit Binary Rate Multiplier |
| 74175 | Quad Type D Flipflop |
| 74193 | Presettable 4-Bit Binary Counter |
| 7805 | Five Volt Regulator |

Figure 11B:
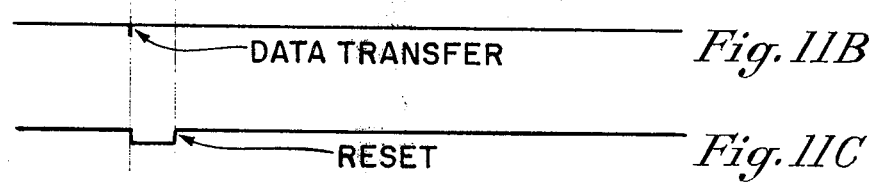
Figure 11C:
Figure 14A:
FIGS. 14a–14e are timing diagrams useful in understanding the present invention.
Figure 14B:
Figure 14C:
Figure 14D:
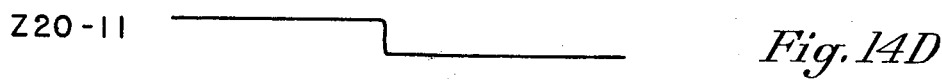
Figure 14E:
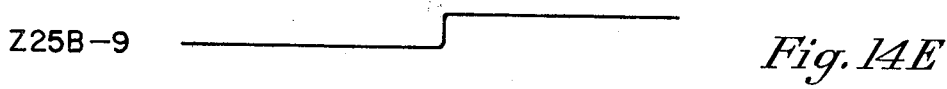

The following detailed description shall start with the assumption that a prior measurement has been just completed and a new measurement is to be initiated. At the end of the previous measurement, a data transfer pulse occurs as illustrated in FIG. 11b. Immediately after the data transfer pulse, a reset signal (See FIG. 11c) is produced which is employed to zero out the input buffer ZB, the differential integrator ZC, and the zero comparator ZD. In addition, the reset signal, along with the data transfer pulse, clears all of the counters of the main frame system. Referring to the schematic, FIGS. 13a, 13b, and 13c, there is illustrated a data transfer pulse line labeled $\overline{DT}$. The data transfer pulse is a negative going pulse having a pulse width of one-half of a microsecond. On the schematic, a line drawn over a signal defines that condition to be true when the signal is low. If there is no line drawn over the signal, that condition is defined to be true when the signal is high. This is consistent with conventional logic. A low is approximately zero volts and a high is approximately 3 volts.

The data transfer pulse is routed to the clear input of the flipflop Z25A. When it goes low, it wil cause Z25A to clear. This causes the Q output of Z25A to go to zero. Data transfer also is routed to Z30D which is a buffer which inverts the signal to obtain a positive representation of data transfer. This positive representation of data transfer is routed to the clear input of Z33 which causes all of the outputs of Z33, QA, QB, QC, and QD to go to zero. Thus, the data transfer pulse has reset the entire memory address, Z25A and Z33, thereby placing their outputs in the zero state. This has caused the address to go to zero so that word zero in memory is being addressed. This means that word zero is coming back through B0-B7.

The data transfer pulse also is routed to the LD (load) input of Z39 of the slope counter. When that input goes low, the binary data on the ABCD inputs are loaded into Z39 whereby the first four-bits (B4-B7) of the initial slope are loaded into Z39 prior to making a measurement.

Thus, when data transfer goes low, which is true, the outputs of Z25A and Z33 go to zero and word zero is routed back from memory. In addition, data on lines B4-B7 are loaded into Z39 by data transfer. When the data transfer pulse goes back up high, it locks those 4-bits into Z39 which will be at the end of the one-half microsecond pulse.

As indicated above, B4-B7 represents the least four significant bits of the initial slope of the first word. The fact that these are the least four significant bits is an arbitrary choice and the four most significant bits could have been loaded rather than the four least significant bits.

As mentioned above, word zero also defines the address of the next word. It will be noted that data transfer also is routed to another inverter Z30E which produces a positive pulse. This pulse is routed to the clock inputs of the segment rate latch Z32 which is a quad storage latch, a storage device that will store four bits of binary data. When the clock inputs to Z32 go positive, the data at inputs D1-D4 are stored in Z32. Note that this data is B0-B3. Thus, as long as data transfer is negative, the four bits of data, B0-B3, will be loaded into Z32. When data transfer goes positive, the data is locked into Z32. Thus the first word, word zero, of data is transferred out of memory and loaded. This is done before a measurement is started.

Another word of data from the memory still remains to be loaded before a measurement is started. This data are the remaining 8-bits of data of the initial slope. The memory must be addressed to obtain this data and this data must be loaded into the linearizer. Q1-Q4 is the output of the data loaded into the segment rate latch Z32. These outputs are fed into Z33 of the memory address counter. Immediately after the data transfer pulse, a reset pulse is produced as mentioned above. Referring to the reset line, when reset is true, it goes low. The reset signal is fed into the load input of Z33 enabling Z33 to be loaded with the data coming from Q1-Q4 of Z32. Thus the memory address counter now is preset to the number specified by B0-B3 of the first word. Recall that the Q output of the flipflop Z25 was cleared initially. This flipflop specifies the least significant bit of the address. Since the output of zero has not been changed, the second word has a least significant bit for the address of zero. This defines the address of the second word as always being even numbered. Thus, when reset goes low, the second word is addressed and data is now transferred out from the second word in memory. As indicated above, this word is not located in the address of memory, labeled "one". The address in which this word is located is the second address which the system has gone to or specified and data is coming out. This data is the 8 most significant bits of the initial slope and must be loaded into the two counters Z40 and Z46. Note that reset is routed to the load inputs of the two counters Z40 and Z46. When these inputs go low, it enables the 8 bits of data of the second address to be loaded into Z40 and Z46. Thus, now all 12 bits of the initial slope have been loaded into the slope counter. All of this has happened before a measurement has been initiated.

The source of reset is the Q output (pin 12) of flipflop Z16A. This output is low during reset and is routed by the reset line to an inverter Z26A whose output will be high during reset. This output is routed to counters Z20–Z24 and clears these counters to zero. Z20–Z24 are all 4-bit binary coded decimal counters which form the 100,000 count accumulator. Each of these counters counts to ten and starts over again. They each will handle zero through 9. In addition, the inverse of the data transfer pulse is routed from Z30D to pins 2 and 3 of Z8, Z18, and Z19 to clear those counters and to pin 13 of Z31 to clear the counters of this rate multiplier. Data transfer also is routed to inverted Z30F to produce a high going pulse which is fed to the clear inputs of Z44 and Z45 to cause all of their counters to reset to zero. It is also fed to pin 13 of Z41 and clears its counters. The same pulse that resets Z41 is fed to pin 2 and 3 of Z28 and Z38 and clears those counters. Thus, with the data transfer pulse and the reset pulse, all of the counters have been cleared, the initial slope has been loaded into the slope counter and the memory address has been preset with the initial address. As indicated above, the reset signal also zeros out the input buffer ZB, the integrator ZC, and the comparator ZD. Thus, the system is ready to begin a measurement.

The circuit formed by Q1 which is a unijunction transistor 2N4853 and the timing R-C network R6 and C3 is a relaxation oscillator, which oscillates continuously. It produces a one millisecond pulse once every second. As will be recalled, to begin a measurement, the unknown signal must be selected and fed to the integrator for a known period of time. This time is measured by a one megahertz clock signal which is fed from the clock generator 57 to counter Z20-Z24, which has been previously cleared. Since each of these counters are divided by 10, it takes 100,000 counts to fill the counter. 100,000 counts with one megahertz signal results in exactly 100 milliseconds. At that time, the most significant counter, Z20, will produce an overflow output.

The actual initiation of the measurement occurs when the timer formed by the relaxation oscillator times out. When it times out, the transistor, Q1, will break down and a positive voltage will be produced at its output. Z7F and Z7E form a schmitt trigger type of device whereby the input thereto will increase until a threshold is reached such that they will switch over rapidly. Z7C, Z7B, and Z7D, along with a one megahertz crystal XTL1, form a crystal oscillator (clock generator 57), which produces a one megahertz signal. Z7A is a buffer while TP6 is a test point. The output of the buffer is the one megahertz clock signal which is constantly clocked into flipflop Z17A. When the unijunction oscillator times out, the outputs of Z7F and Z7E will change states momentarily. Right after that happens, on the next clock pulse, the output of Z17A will change states. Thus, the initiation of the measurement is synchronized with the clock signal.

Pin 13 of Z17A is normally low so that when the unijunction oscillator times out, the output of pin 13 will go high for about 1 millisecond. At the end of the positive pulse, the output on pin 13 will go low. As a result, a positive going pulse is produced on pin 13 of Z17A which is synchronized with the clock. This is called the indexing pulse which is routed to the clock input of flipflop Z16A. The state of Z16A represents whether or not the system is in reset. At the end of a last measurement, a clear signal is produced which is applied to the input pin 2 of Z16A. Until Z16A toggles, it is in a state such that the output on pin 12 is low and the output on pin 13 is high. Pin 12 being low results in a reset condition. Z16A has the characteristics so that triggering occurs when the clock pulse input to it goes high and then low, triggering occurring on the trailing edge of the pulse. The J and K inputs are wired so that no matter what state the flipflop is in, it will toggle and will change states when a clock pulse is applied to its clock input. Prior to the indexing pulse, Z16A is in reset. The indexing pulse applied to pin 1 causes the flipflop Z16A to change states so that the system no longer is in reset. When that happens, pin 12 goes high and pin 13 goes low. The high output from pin 12 is routed to the pin 2 input of AND gate Z42A which is capable of producing a positive output if two positive signals are applied to its two inputs. Due to the positive input applied to pin 2 of Z42A from pin 12 of Z16A, AND gate Z42A is now qualified for producing an output upon the reception of a high input on pin 1. The high output from the AND gate Z42A is designated as the signal described previously which opens the analog gate SW-A to allow passage of the signal input from the sensor to the integrating circuitry. Pin 1 of Z42A is connected from pin 8 of flipflop Z16B. The output produced from pin 8 is designated "not spill". It will be recalled that when the system is in reset, the output from pin 12 of Z16A is low. That output is fed into pin 6 of Z16B which is the clear input. This causes the flipflop Z16B to clear whereby the output from pin 9 is low and the output from pin 8 is high. Thus there are now two positive levels applied to the inputs of the AND gate Z42A, thereby producing a positive output.

As mentioned previously, this positive output selects the signal from the sensor and routes it to the integrator. Since the output from pin 9 of Z16b is low and this output is applied to pins 9 and 4 of AND gates Z42C and Z42B, these gates cannot be qualified whereby the plus or minus reference voltage cannot be selected at this time. In addition, since the state of the flipflop Z16A has been changed by the indexing pulse, the output from pin 12 is high whereby the output from the inverter Z26B is low. Thus the signal applied to the range module by way of the reset line is low whereby the range module no longer is in the reset condition. Hence at the trailing edge of the indexing pulse, the signal from the sensor is applied to the integrator which generates the ramp previously described. The reset signal is no longer low so that the counters Z20-Z24 are no longer being cleared to zero. Since Z16A is no longer in reset, the output from pin 12 is high which is fed to pin 10 of NAND gate Z27C. It will be noted also that the clock signal coming from the clock generator from test point 6 also is routed to pin 9 of Z27C. If pin 10 is high, then the output at pin 8 will be the inverse of the input applied to pin 9. Thus, the output on pin 8, when the input to pin 10 is high, is the inverse of the clock signal, the clock signal being a positive pulse. This inverted clock signal is applied to pin 12 of OR gate Z36D. If any of the inputs to Z36D is high, then the output will go high. It will be noted that the output from pin 8 of Z27C also is routed to pin 1 of OR gate Z36A. Thus, the pulses from Z27C are fed through Z36A and inverted by inverter Z26D. The output of Z26D is fed to OR gate Z36B. Thus, the true clock pulses come out of Z36B, pin 6. They are labeled "accumulate". It will be noted that the output of Z36B is fed into pin 14 of Z24 which is the input to the accumulator or pulse counter. Thus, at this time, one megahertz pulses are being applied to the accumulator. This is the initiation of the measurement and it is continued for 100 milliseconds.

Referring again to the range module (FIGS. 8 and 12), the signal from the sensor is applied to the signal conditioning circuitry 103 and then to pin 1 of the analog switch SW-A. The signal from the sensor thus is routed into pin 1 of ZA and out of ZA on pin 2 to the buffer amplifier ZB which is an amplifier with a high input impedance with a gain of 1. Thus, the same voltage is applied to the integrating resistor R17. The polarity is not inverted by the buffer amplifier ZB, but the integrator ZC does invert the signal. Thus, the signal coming out of the integrator amplifier ZC will start generating a ramp voltage opposite the polarity of the input signal. If there is a positive input signal, then ZC will produce a negative going ramp. The output of the integrator also is amplified by the circuit designated as ZD which is a comparator employed to determine polarity. During discharge of the integrator, when its output crosses zero, the output from the circuit ZD will change from a plus to a minus or a minus to a plus whereby the output of ZD is a representation of the polarity. ZD also acts as an inverter. Thus, the signal is applied to two inverters, the integrator ZC, and the circuitry ZD whereby the polarity output of ZD is the same as the original polarity of the input signal. The output from ZD is applied to a buffer transistor Q1 of 111 whose output is labeled "zero". The transistor Q1 is also acts as an inverter. Thus from the output of Q1 to the signal input, there is a total of three inversions, which is equivalent to one inversion. If the output of Q1 is positive, the input signal is negative. If the output of Q1 is negative, then the input is positive. This output is fed to pin 2 of the main frame flipflop Z37A.

At the end of the 100 milliseconds, 100,000 counts have been accumulated in the counters Z20–Z24. That will be the only time that pin 11 of Z20 will go positive and then negative. When it goes negative, it goes negative on the 100,000 count. This signal is routed to pin 5 of flipflop Z16B. Z16B is connected such that if a clock pulse is applied to the flipflop, its output will change states if it has been cleared by the reset signal, which, as indicated above, has taken place. Thus pin 9 will go high and pin 8 will go low. When pin 8 goes low, this is taken to mean that the spill condition is true. When pin 8 goes low, AND gate Z42A is disqualified for selecting the signal from the sensor. Since pin 9 has gone high, AND gates Z42B and Z42C have been qualified. One of these AND gates will be selected so that either a plus or minus reference will be selected. This depends upon pin 10 of Z42C or pin 5 of Z42B whether or not a plus or minus reference will be selected. If the input that comes in on pin 3 of Z37A is followed, it will be noted that it is clocked by the clock frequency. This is done to insure that any change of state of the "zero" signal, which is actually a representation of an analog signal, is synchronized with the clock. Each time a clock pulse occurs there is an opportunity to change the state of the output of Z37A depending upon the input applied to pin 2. A positive input means that the unknown voltage was a negative signal because of the inversion process employed in the range module. If the input to pin 2 of Z37A is positive, the output on pin 5 is positive when a clock occurs. The output of pin 5 is applied to pin 12 of flipflop Z37B. The system now is at the point where the 100,000th count has occurred, signifying that 100 milliseconds of initial slope integration has been performed. Thus the trailing edge of the 100,000th count is being produced. At this point, several things must be done. The correct reference voltage must be applied to the integrator and the accumulator Z20-Z24 must be used to accumulate pulses which will eventually be displayed. Thus up-dating must be accomplished that will stop pulses from being routed into Z20-Z24 from the clock and which will allow Z20-Z24 to start accepting pulses from the linearizer. This will be done in less than one count from the clock. When Z20-Z24 accumulates 100,000 counts, it will start over at zero. That event is sensed by pin 11 of Z20 going positive and then negative. When the output of pin 11 of Z20, went negative, it caused the flipflop Z16B to toggle. When flipflop Z16B toggled, it did two things. It disabled AND gate Z42A that passed the signal from the sensor. Z42A is disqualified since the output on pin 8 of Z16B went low. At the same time, pin 9 of Z16B goes high, qualifying gates Z42C and Z42B. Only one of these gates will be energized, the one which will select the proper reference voltage to drive the integrator back down to zero. The polarity of the integrator can be determined by looking at the zero signal applied to pin 2 of flipflop Z37A. The zero signal is synchronized with the rest of the digital circuitry by this flipflop. Clock pulses from the clock generator are constantly applied into pin 3 of Z37A so that the only time that the outputs on pins 5 and 6 of Z37A can change are in synchronization with the clock. Thus the flipflop Z37A follows the zero signal but it follows it in synchronization with the clock signal. As indicated above, the output of pin 5 of Z37A is applied to pin 12 of flipflop Z37B. Before the initiation of the measurement, the reset line was low which caused Z37B to clear. Thus until Z37B toggles, its output at pin 8 is high and its output at pin 9 is low. The only time that Z37B can toggle is when a spill condition occurs which is at the 100,000th count, when the system changes to the reference integration. When the 100,000th count causes Z16B to change its state, its output at pin 9 will go high. This high output is fed into pin 11 of Z37B, as the clock input. Thus, at that time, the outputs of Z37B, pins 9 and 8 will set according to the condition of the input applied to pin 12 which represents the polarity of the integrator at that time. If the input on pin 12 is low, there will be no change but if it is high, Z37B will change states. When it changes states, if pin 9 of Z37B goes high when the spill condition comes true, then a high signal is applied to pin 2 of NAND gate Z27A. This means that the zero signal was a high.

Thus at the end of the 100,000th count, Z37B is set according to the input on its pin 12 and the polarity of the zero signal at its peak is stored in Z37B. This information will be used to detect when the integrator discharges through zero. Meanwhile, Z37B is storing the polarity.

If the zero signal is positive, then pin 5 of Z37A will be positive, which makes pin 9 of Z37B positive. If the zero signal is positive, then the signal input is negative. Upon following the output of pin 9 of Z37B, it is noted that it is applied to pin 9 of Z42C. When the output of pin 9 of Z37B is high, it qualifies AND gate Z42C which selects the plus reference voltage. Referring to the thermocouple range module, it can be understood that if the input signal from the sensor is negative, the second output of the integrator ZC will go positive and in order to drive it back down toward zero, a positive reference signal must be selected for application to ZC. Thus when Z42C is energized, it selects a positive reference to drive the integrator back to zero. If Z37B toggled in such a manner that its output pin 8 was positve, then that would have indicated a negative zero signal which indicates a positive unknown voltage and Z42B would have been energized to select the minus reference voltage instead of the plus.

Thus, on the 100,000th count, the flow of the unknown signal to the integrator has been interrupted and it has been replaced with the reference voltage, the polarity of which will drive the integrator back down to zero.

Now there is only one thing left to do before the system will start linearizing. That is, the next word in memory must be addressed to obtain its second slope data. Z16B pin 9, the spill signal, goes positive on the 100,000th count. If the output of pin 9 is followed, it can be seen that it is routed to pin 7 of flipflop Z25B. The purpose of the flipflop Z25B is to obtain a pulse delayed from spill by one-half of a clock pulse. The 100,000th count occurs when the clock signal goes low. It is seen that the clock signal out of Z7A is routed into pin 9 of Z27C which is qualified at pin 10 by the reset signal being high since the system is not in the reset mode. Thus inverted clock signals are obtained from Z27C, pin 8 and those inverted clock signals are fed to pin 5 of Z25B as the clock input to that flipflop. Bear in mind that that is the inverse of the clock and the counts that are accumulated in Z20–Z24 are counted on the trailing edge of the clock so that when the clock signal goes down, one count is counted. On the 100,000th count, pin 11 of Z20 goes low and spill, pin 9 of Z16B, goes high. Spill is routed into pin 7 of Z25B. Until this time, pin 9 of Z25B has been low but now the input to pin 7 has gone high and as soon as it is clocked, that high signal will be transferred to pin 9. Z25B is clocked one-half of a clock cycle after the clock pulse whereby the high on pin 9 of Z25B will be obtained one-half of a clock pulse after the 100,000th count.

Referring also to FIGS. 14a–14e, a further explanation now will be given. As indicated above, the inverse of the clock signals is fed into pin 5 of Z25B. Hence, when the clock pulse goes high, the inverse goes low. Assume that the 100,000th count occurs at the arrow shown in FIG. 13a. At that time Z20, pin 11 goes low and Z16B, pin 9 and hence Z25B, pin 7 goes high. When Z25B, pin 7 goes high, on the next clock pulse into pin 5 of Z25B, the state of pin 7 will be transferred to pin 9. When the 100,000th clock pulse goes low, Z25B, pin 5 is high. Before the state of pin 7 can be transferred to pin 9, the voltage at pin 5 of Z25B must go low and this occurs one-half of a clock pulse later. Hence a high is obtained from Z25B, pin 9, one-half of a clock pulse after the 100,000th count. The signal on pin 9 of Z25B is fed to NAND gate Z15D, pin 13. That signal is called initiate linearization and is identified as IL.

Recall that initially word zero of memory was addressed and data obtained including the address of the next word. The next word was addressed and the data loaded into Z40 and Z46. The system is still on that next word. Before the system can began the first segment of linearization, it must move to the subsequent word, which will be higher or lower than the second depending on the polarity, and obtain the second slope data. In order to do this, the address counter must be incremented. This is the purpose of the initiate linearization signal.

Note that the output of gate Z15D is fed to Z25A which is the least significant bit counter for the address. Z25A is arranged with high inputs to both of its J and K inputs. This means that every time Z25A receives a negative going clock signal, it toggles and changes states. Prior to the one-half of a clock cycle after the 100,000th count, the input to NAND gate Z15D, pin 13 was low. This results in a high output on pin 11. One-half of a clock cycle after the 100,000th count Z15D, pin 13 goes high. Assume now that pin 12 is high. Z15D will have two high inputs and a low will appear on its output pin 11. The transition on pin 1 of Z25A from a high to a low causes Z25A to toggle. Recall that Z25A was initially cleared to zero. WHEn Z25A toggles, the memory address is now advanced in one direction or stepped back in one direction from its previous state. Thus the system has now moved on to the next word address in memory and second slope data from that word is fed into the linearizer. If for example, the address of the second word was the address labeled "ten", the next address will be "nine" or "eleven", depending upon whether the voltage measured is positive or negative. If it is positive, as the system advances throughout the range of the instrument, it will advance in a positive direction all the way up through word 31, if the magnitude of the measurement is sufficient, until it gets back to word zero. If it is negative, it will back off until it gets to word zero, again assuming that the magnitude of the measurement is sufficient for this to occur. The sign of the signal is being stored in Z37B and the information in Z37B is applied to the lines on the main frame schematic labeled (−) and (+) sign. The (−) sign line goes to Z35A, pin 13 and the (+) sign line goes to Z35B, pin 5. The outputs on these lines determine whether the address counter Z33 counts up or down.

Since Z25A represents the least significant bit, it will change states as it is toggled from a one to a zero or from a zero to a one regardless of which direction the curve is going. By obtaining the one-half of a clock cycle delayed signal to toggle Z25A, the address counter is either advanced or stepped by one count whereby the system has moved off of the second address, i.e. word ten, onto the next word.

The 8 most significant bits of the initial slope are stored at a position dependent upon the range of the sensor. For example, if the system is to measure as much positive voltage as negative voltage, then there would need to be as much positive range as negative range. That would indicate that the second word would be stored around the middle of the memory. If, however, there was a large amount of positive range and very little negative range, then a large number of the addresses in memory would be devoted to the positive range whereby the second word would be stored at a lower position, i.e. address number four.

It is noted that spill coming out of Z16B, pin 9 is also routed to AND gate Z42D. Pin 13 of this gate is pulled up through resistor R11. Thus, since spill is high on pin 12, pin 11 will go high. The output on pin 11 is routed to OR gate Z36A, pin 2 and to inverter Z26E, pin 11. The output of the inverter Z26E, pin 10, will go low while the output of Z36A, pin 3 will go high and it will stay high no matter whether the other input at pin 1 is high or low. While the integrator was generating the ramp, inverted clock pulses were routed from Z27C through Z36A and were inverted back to their original state by Z26D. Now Z36A is locked up high and the clock pulses will no longer be passed. These inverted clock pulses, however, also are routed to pin 10 of Z36C. Prior to spill, a high was applied to pin 9 of Z36C that was blocking the passage of clock pulses. The output out of pin 8 of Z36C was locked up high. Now, however, there is a low at Z36C, pin 9 and the output of Z36C pin 8 will follow pin 10 which is the inverted clock pulses. They are routed out through pin 9 of Z41 which is the second slope multiplier and to pins 9 of Z44 and Z45 of the slope multiplier as their clock inputs. The clock pulses from Z36C also are routed to pin 9 of the segment rate multiplier Z31. Thus, the linearizer can now begin to function. The frequency output of the rate multiplier Z44, Z45, which is at pin 6 of Z45 will be dependent upon the state of the 12 input lines coming from the slope counter, Z39, Z40, and Z46. Those 12 lines coming out, four bits each on pins 2, 3, 6, and 7 of Z39, Z40, and Z46 are routed to the A through F inputs of Z44 and Z45. The frequency out of pin 6 of Z45 is a function of the number or word that was initially loaded into Z39, Z40, and Z46. Thus linearization has started at a given slope.

Clock pulses are also routed to pin 9 of Z41 the second slope multiplier and the output frequency from this circuit at pin 6 will be determined by the state of the number, inputs A-F, that are coming from the memory. The output pulses from Z41 are routed to pin 14 of Z28 and to pin 4 of Z29B. As indicated above, Z29A, Z29B, Z29D, and Z29C form a switch that determines whether or not the input to Z38 (which is divide by 10), will come directly from Z41 or will be divided first by 10 by Z28. Thus, depending upon whether the bit on B6 is high or low, the output frequency of Z41 will be divided by 10 Z38 or by 100 by Z28 and Z38. The output of Z38 is fed to another gating arrangement formed by Z43A, Z43B, and Z43C. It is routed to pin 5 of Z43B and to pin 1 of Z43A. If the bit on B7 is high, then Z43A will be qualified and the output counts from Z38 will be fed through Z43A into the count down input of Z39 at pin 4. If the bit on B7 is low, however, Z43A will not be qualified. This bit will be inverted by Z43C and its output will qualify Z43B. The output counts from Z38 thus will be passed through Z43B to the count up input of Z39, pin 5. Thus the data on B7 represents the sign of the second slope and tells the system whether the first slope should be increasing or decreasing.

Thus, when linearization begins, the system starts with an initial slope value in Z39, Z40, and Z46 and that value is modified with pulses from Z41, by way of Z38 or Z28 and Z38 at a rate determined by the memory word coming out of the memory. The clock pulses are being fed to the rate multipliers Z31, Z41, Z44, and Z45. As indicated above, Z32 and Z31 act to divide the full scale of the clock pulses and hence the full range of the sensor into equal segments. The four bit number that was stored in Z32 from B0-B3 of the data of word zero that specifies the initial address of the second address word is complemented in that its inverse is fed to Z31. This causes the output frequency of Z31 at pin 6 to be such that after it is divided down by 1600 by Z19, Z18, and Z8, memory will be cycled through in 102,400 counts for a full scale measurement. At the beginning of a measurement, Z19, Z18, and Z8 were cleared whereby the output at pin 11 of Z8 was a low. This output was inverted by Z15C insuring that pin 12 of Z15D was a high thereby qualifying Z15D so that the address counter could be advanced. Linearization continues with the address counter being advanced every time counter Z8 is cycled through. This changes the address of the address counter to obtain new second slope data for a different segment to change the rate at which the first slope is increased or decreased.

There will be now described the manner in which the end of a measurement is terminated. As the ramp of the integrator during discharge, passes through zero, the state of its voltage output will change from a positive to a negative or from a negative to a positive. This change of state is detected by the zero comparator ZD and inverted and amplified by Q1 of buffer 111. Its output called "zero" is the input to pin 2 of Z37A. When the ramp passes through zero, the state of Z37A will change. Recall that Z37B was storing the state of the ramp at its peak. Thus, the state of Z37A, when it changes, will be different from that of Z37B. AND gates Z27A and Z27D are employed to detect when this difference occurs, which indicates that the ramp has crossed through zero. If, for example, the input to pin 2 of Z37A had been positive at the peak, then the output of Z37B, pin 9 would be positive. When Z37A changes states, the output of Z37A, pin 6 will go high. Z37B, pin 9, is fed to Z27A, pin 2, and Z37A, pin 6 is fed to Z27A, pin 1. The two highs on this gate will cause the output at pin 3 to go low which would indicate a change of state from one direction to the other. If Z27D were qualified, its output at pin 11 would go low. Either one of Z27A of Z27D being qualified indicates that the ramp has crossed through zero and Z20-Z24 is to stop accumulating pulses.

The outputs of Z27A and Z27D are routed to NOR gate Z35C. Any lows on pins 9, 10, or 11 of Z35C will produce a high on pin 8 and the high on pin 8 is "anded" with the high of the spill line at pin 5 of AND gate Z27B. This will produce a low at Z27B, pin 6. Prior to this time, the reset signal out of Z16A pin 12 has been a high since the system is not in the reset mode. This high is fed to Z27C pin 10 and is "anded" with the clock pulses routed to pin 9. Thus inverted clock pulses are obtained at Z27C, pin 8 and are applied to OR gate Z36D along with the low applied from Z27B, pin 6. Z27B, pin 6 was a high because the output of Z35C, pin 8 was a low, forcing Z27B, pin 6 high. This high at pin 13 of Z36D locks the output of Z36D, pin 11 up high, however, when Z27B, pin 6 goes low, it enables the clock pulses at Z36D, pin 12 to be passed through Z36D out to pin 11. The first clock pulse which is a low going pulse at Z36D, pin 11, is identified as data transfer.

At this time, the ramp voltage has crossed through zero and the number of counts loaded into the accumulator is the information desired. The accumulator is to terminate counting and its data is to be transferred into storage for display purposes. Data transfer out of Z36D, pin 11 is routed to Z26F pin 13 and inverted, and the output of Z26F at pin 12 is fed to pins 9 of Z10, Z11, Z12, Z13, and Z14 which are quad storage devices that will store the data fed into it, four bits each. The data that is fed into these devices are the outputs of the counters Z20–Z24. The high going pulse at pin 9 of these storage devices loads Z10–Z14 with the data that is available at Z20–Z24. The outputs of Z10 through Z14 are fed to Z2–Z6 respectively which are seven segment decoders designed to drive lamps L1-L5, which are seven segment lamps, according to the digit being fed to them at their inputs. Z20–Z24 are decimal counters, each of which count from zero up through 9 and start over again. Thus, a binary code is applied out of the counters of four bits each that will represent a number, zero through 9. This binary code is stored in the storage device Z10–Z14 and fed from the storage device to the decoders Z2–Z6 which will decode the zero through 9 inputs into the seven segment drive. Since each segment lamp has ten states, a number up to 99,999 may be displayed.

Z9B is used to store the polarity of measured voltage. A high out of pin 8 represents a negative voltage. Under this condition, the middle segment of display lamp L1 is lit (through Z1D) representing a minus sign.

Thus, the desired number has been transferred into storage and the measurement cycle starts over again with data transfer. It is noted that data transfer is routed from the output of Z26F, pin 12 to pin 5 of flipflop Z17B. Z17B previously had been cleared by the reset signal and now when the data transfer pulse comes in on pin 5 of Z17B, Z17B will change states causing Z17B, pin 8 to go low. When it goes low, it is fed to Z16A, pin 2, the clear input and it clears that flipflop which is the reset flipflop. When Z16A changes state, pin 12 goes low, which is reset. Thus, Z16A has gone to the reset condition and the output of pin 12 which has gone low is routed back to Z17B, pin 6 clearing this flipflop. This flipflop thus is only set for a few nanoseconds.

In making measurements, there is the possibility that a signal may be too high or too low for the instrument to measure i.e., it is beyond the capabilities of the instrument. This is defined as an overflow condition. Provision is made for the instrument to sense an overflow condition. When the system is making a measurement, no matter in which direction in memory it is advancing, either positive or negative, eventually it will get back to word zero assuming that the magnitude of the measurement is sufficient for this to occur. Word zero, however, is not a useable word for linearization in that it does not represent second slope data. It represents the initial slope and the first word address. Thus, if the system gets back to word zero in memory during the time of linearization when the integrator is integrating back to zero any more accumulation of data would be useless since the system would not be linearizing correctly. The system, however, senses if it cycles back to word zero during linearization and hence senses the overflow condition. It is noted that the word address is routed to OR gates Z34A–Z34D and is routed so that if all of the inputs to these gates are low (meaning word zero is being addressed), then the output at Z34C, pin 8 will be a low, which is labeled overflow. Any time overflow goes low, during the period that the integrator is integrating back to zero, then it is known that an overflow condition has occurred. The system needs to detect overflow going low only during the time that the integrator is integrating back to zero. It is noted that overflow is routed to Z35C along with the outputs of the two change of state gates Z27A and Z27D. Thus, if either overflow or either one of the two change of states conditions goes low, then the output of Z35C, pin 8 will go high. The output of Z35C is routed with spill to AND gate Z27B. Spill is high during the time that the integrator is integrating back to zero. Thus, overflow will cause Z27B to go low thereby causing a data transfer pulse to be produced at Z36D, pin 11, which will stop the measurement. It is noted that overflow is also routed to pin 4 of Z15B. When it goes low, it causes Z15B, pin 6 to go high which is fed into pin 1 of Z9A. When pin 1 is high, Z9A will not be held clear. A low is required on pin 1 to clear Z9A. The inverse of the data transfer pulse is also routed to pin 3 of Z9A and its output at pin 6 is fed back to pin 2. Each time Z9A receives a transfer pulse on pin 3, it will toggle unless it is held at one particular state by overflow being high. The inverse of the data transfer pulse also is routed to Z15B, pin 5. If overflow is high, a low will occur at pin 6 of Z15B and hence at pin 1 of Z9A causing it to clear. Thus, everytime a transfer pulse is received, Z9A will not toggle but when the overflow goes low, Z9A starts toggling. When pin 5 of Z9A goes low, Z15A pin 3 will go high and vice versa, every time pin 5 goes high, Z15A, pin 3 will go low. When it goes low, it clears all of the storage registers Z10 through Z14. In addition, Z9A, pin 6 will go low when the clear line going in on pin 1 of Z10–Z14 goes low. This low coming out of pin 6 of Z9A is called a ripple blanking input and is fed into the inputs on pins 4 of decoders Z4, Z5, and Z6. When this line goes low, none of the segments of Z4, Z5, and Z6 will be energized or lit. There is an automatic decoding of zero condition on Z2 and Z3. Anytime a zero comes into the inputs of Z2 and Z3, none of their segments will light up. Since Z10-Z14 have been cleared, the inputs to Z2 and Z3 will be zero whereby Z2 and Z3 will not produce a display. Z4-Z6 have been blanked so that no lights will be displayed every other measurement resulting in a flashing display that goes on and off when the system is beyond full scale. As an example of an overflow condition, if 750° is full scale and the temperature being measured is 800°, an overflow condition results. When this occurs, the display flashes on and off telling the operator the measurement is not good. The display will continue to flash until the temperature being measured comes back within the range of the instrument.

If switch SW1 is pushed, the line labeled lamp test will go low and it is fed to the lamp test inputs on pins 3 of Z2–Z6. It has the function of lighting up all of the segments in each seven segment display resulting in a reading of 88,888 which tells the operator whether all of the lamp segment are good or if some are burned out.

The programmable read only memory is identified as HPROM-1-8256-5B and is manufactured by Harris Semiconductor of California.

As one example, the second slope data stored in B7-B0 of one of the addresses of memory may be the binary number 00001011. For this number, the zero in bit 7 represents a positive second slope while the zero in bit 6 will instruct the linearizer to divide the output of the second slope multiplier by 100. The remaining 6 bits (the second slope data) in B5-B0 (001011) represent the decimal number 11. Assuming that second slope data is stored in 25 addresses rather than 30 and that the value of K in equation (1) for the binary rate multipliers is equal to 64, then the count change in the slope counter while the linearizer passes through the corresponding segment may be calculated. as follows:

$$\text{Count Change} = \frac{11 \cdot 4095}{64 \cdot 100}$$

In this equation, the number 4096 is determined by dividing 25 segments into the full count range which is 102,400 as indicated above. The 100 in the numerator is the divide by 100 instructed by bit 6 and performed by Z28 and Z38. For this particular example, the value contained in the slope counter will be increased by about 7 counts as the linearizer passes through the corresponding segment.

Although the present system has been described for use with a sensor or transducer such as a thermocouple or with devices for obtaining resistance-temperature measurements, it is to be understood that it may be employed to make other types of measurements where a predetermined non-linear relationship occurs.

I claim:

1. Apparatus for producing an accurate measurement of the engineering units of interest represented by the output signal of an analog transducer having a non-linear output function, comprising:

an analog-to-digital converter for producing a digital output comprising a quantity of constant frequency pulses representative of the magnitude of the output signal of said analog transducer, storage means for storing a plurality of data functions, each of which is a function of the rate of change of the slope of the non-linear output function of said analog transducer within a different segment of a given range of the non-linear output function of said analog transducer, means responsive to said constant frequency pulses and responsive to said data functions stored for converting said constant frequency pulses to output pulses whose frequency changes linearly within each segment at a rate dependent upon the corresponding data function, and means for accumulating said output pulses for the production of an accurate measurement of the engineering units of interest represented by the analog transducer output signal.

2. Apparatus for producing an accurate measurement of the engineering units of interest represented by the output signal of an analog transducer having a non-linear output function, comprising:

an analog-to-digital converter for converting the magnitude of the output signal of said analog transducer to a time period representative of said magnitude and for producing during same time period a digital output comprising a quantity of constant frequency pulses representative of the magnitude of the output signal of said analog transducer, storage means for storing a plurality of data functions, each of which is a function of the rate of change of the slope of the non-linear output function of said analog transducer within a different segment of a given range of the non-linear output function of said analog transducer, means responsive to said constant frequency pulses produced and sequentially responsive to said data functions stored for producing second pulses at a frequency which is a function of the rate of change of the slope of the non-linear output function of said transducer within said segments of the non-linear output function of said analog transducer, means responsive to said constant frequency pulses and to said second pulses for producing output pulses at a frequency which changes linearly within each segment at a rate dependent upon the corresponding data function, and means for accumulating said output pulses for the production of an accurate measurement of the engineering units of interest represented by the analog transducer output signal.

3. Apparatus for producing an accurate measurement of the engineering units of interest represented by the output signal of an analog transducer having a non-linear output function, comprising:

an analog-to-digital converter for converting the magnitude of the output signal of said analog transducer to a time period representative of said magnitude and for producing during said time period a digital output comprising a quantity of constant frequency pulses representative of the magnitude of said output signal of said analog transducer, storage means for storing a plurality of data functions, each of which is a function of the rate of change of the slope of the non-linear output function of said analog transducer within a different segment of a given range of the non-linear output function of said analog transducer, first conversion means responsive to said constant frequency pulses and sequentially responsive to selected ones of said data functions stored for producing second pulses at a frequency which is a function of the rate of change of the slope of the non-linear output function of said analog transducer within said segments corresponding to said selected data functions, counter means responsive to said second pulses for producing a binary output which is a function of the slope of the non-linear output function of said analog transducer within said segments corresponding with said selected data functions and which changes at a rate which is a function of the rate of change of the slope of the non-linear output function of said analog transducer within said segments corresponding with said selected data functions, second conversion means responsive to said constant frequency pulses and to said changing binary output for producing output pulses at a frequency which changes linearly within each segment at a rate dependent upon the corresponding data function, and means for accumulating said output pulses for the production of an accurate measurement of the engineering units of interest represented by the analog transducer output signal.

4. The apparatus of claim 3 wherein said first and second conversion means comprise binary rate multipliers each of which is capable of producing an output frequency $f_{out}$ having the following relationship:

$$f_{out} = \frac{M \cdot f_{in}}{K}$$

wherein:
$f_{in}$ is the frequency of input pulses,
M is a rate input which is a binary number, and
K is a constant.

5. In a system including an analog-to-digital converter, storage means for storing a plurality of data functions each of which is a function of the rate of change of the slope of the non-linear output function of an analog transducer within a different segment of a given range of the non-linear output function of said analog transducer, linearizing means, and accumulating means, the method of producing an accurate measurement of the engineering units of interest represented by the output signal of said analog transducer having a non-linear output function, comprising the steps of:
  operating said analog-to-digital converter to produce a digital output comprising a quantity of constant frequency pulses representative of the magnitude of said output signal of said analog transducer,
  storing a plurality of data functions, each of which is a function of the rate of change of the slope of the non-linear output function of said analog transducer within a different segment of a given range of the non-linear output function of said analog transducer,
  in response to said constant frequency pulses produced and sequentially responsive to said data functions stored, converting said constant frequency pulses to output pulses whose frequency changes linearly within each segment at a rate dependent upon the corresponding data function, and
  accumulating said output pulses for the production of an accurate measurement of the engineering units of interest represented by the analog transducer output signal.

6. In a system including an analog-to-digital converter, storage means for storing a plurality of data functions each of which is a function of the rate of change of the slope of the non-linear output function of an analog transducer within a different segment of a given range of the non-linear output function of said analog transducer, linearizing means, and accumulating means, the method of producing an accurate measurement of the engineering units of interest represented by the output signal of said analog transducer having a non-linear output function, comprising the steps of:
  operating said analog-to-digital converter to convert the magnitude of the output signal of said analog transducer to a time period representative of said magnitude and producing during said time period a digital output comprising a quantity of constant frequency pulses representative of the magnitude of said output signal of said analog transducer,
  storing a plurality of data functions, each of which is a function of the rate of change of the slope of the non-linear output function of said analog transducer within a different segment of a given range of the non-linear output function of said analog transducer,
  in response to said constant frequency pulses produced and sequentially responsive to said data functions stored, producing second pulses at a frequency which is a function of the rate of change of the slope of the non-linear output function of said analog transducer within said segments of the non-linear output function of said analog transducer,
  in response to said constant frequency pulses and to said second pulses, producing output pulses at a frequency which changes linearly within each segment at a rate dependent upon the corresponding data function, and
  accumulating said output pulses for the production of an accurate measurement of the engineering units of interest represented by the analog transducer output signal.

7. In a system including an analog-to-digital converter, storage means for storing a plurality of data functions each of which is a function of the rate of change of the slope of the non-linear output function of an analog transducer within a different segment of a given range of the non-linear output function of said analog transducer, linearizing means, and accumulating means, the method of producing an accurate measurement of the engineering units of interest represented by the output signal of said analog transducer having a non-linear output function, comprising the steps of:
  operating said analog-to-digital converter to convert the magnitude of the output signal of said analog transducer to a time period representative of said magnitude and producing during said time period a digital output comprising a quantity of constant frequency pulses representative of the magnitude of said output signal of said analog transducer,
  storing a plurality of data functions, each of which is a function of the rate of change of the slope of the non-linear output function of said analog transducer within a different segment of a given range of the non-linear output function of said analog transducer,
  in response to said constant frequency pulses and sequentially responsive to selected ones of said data functions stored, producing second pulses at a frequency which is a function of the rate of change of the slope of the non-linear output function of said analog transducer within said segments corresponding with said selected data functions,
  in response to said second pulses, producing a binary output which is a function of the slope of the non-linear output function of said analog transducer within said segments corresponding with said selected data functions and which changes at a rate which is a function of the rate of change of the slope of said non-linear output function of said analog transducer within said segments corresponding with said selected data functions,
  in response to said constant frequency pulses and to said changing binary output, producing output pulses at a frequency which changes linearly within each segment at a rate dependent upon the corresponding data function, and
  during said time period, accumulating said output pulses for the production of an accurate measurement of the engineering units of interest represented by the analog transducer output signal.

8. Apparatus for producing an accurate measurement of the engineering units of interest represented by the output signal of an analog transducer having a nonlinear output function comprising:

an analog-to-digital converter for converting the magnitude of the output signal of said analog transducer to a time period representative of said magnitude and for producing during said time period a digital output comprising a quantity of constant frequency pulses representative of the magnitude of said output signal of said analog transducer, storage means for storing a plurality of binary functions each of which is a function of the rate of change of the slope of the output function of said analog transducer within a different segment of a given range of the output function of said analog transducer, first and second conversion means each having a first input for receiving a digital input signal, a second input for receiving a binary rate input signal, and an output for producing a digital output whose frequency is proportional to the product of the frequency of the digital input signal and the binary rate input signal, binary counter means having input means for receiving a digital signal and an output for producing a binary output which is a function of the sum of the digital counts applied to its input means, means for loading the initial slope of said output function of said analog transducer into said binary counter, means for applying the digital output of said analog-to-digital converter to said first inputs of said first and second conversion means, means for sequentially applying said binary functions stored in said storage means to said second input of said first conversion means, means for applying a digital signal representative of the digital output of said first conversion means to said input means of said binary counter means, means for applying the binary output of said counter means to said second input of said second conversion means for the production of a digital output comprising output pulses produced at a frequency which changes linearly within each segment at a rate dependent upon the corresponding binary function applied to the second input of said first conversion means, accumulating means for accumulating the digital output of said second conversion means, and display means for displaying the counts accumulated in said accumulator for the production of an accurate measurement of the engineering units of interest represented by the output signal of said analog transducer.

* * * * *